United States Patent
Hoover

[11] 3,944,859
[45] Mar. 16, 1976

[54] BRIDGE-BALANCE DETECTION CIRCUIT

[75] Inventor: Merle Vincent Hoover, Flemington, N.J.

[73] Assignee: RCA Corporation, New York, N.Y.

[22] Filed: Sept. 3, 1974

[21] Appl. No.: 502,670

[52] U.S. Cl. .............. 307/308; 307/251; 250/381; 340/237 R; 323/75 A
[51] Int. Cl.[2] ........................................ H03K 17/00
[58] Field of Search .................................. 328/1–5; 307/308, 309, 251, 214; 340/233, 237 R, 237 S; 250/281; 324/33; 323/75

[56] References Cited
UNITED STATES PATENTS

| | | | |
|---|---|---|---|
| 3,063,010 | 11/1972 | Richardson | 340/233 |
| 3,676,680 | 7/1972 | Scheidweiler et al. | 340/237 S |
| 3,775,616 | 11/1973 | Tagashira et al. | 250/381 |
| 3,860,919 | 1/1975 | Aker | 340/237 R |

FOREIGN PATENTS OR APPLICATIONS
1,088,976  10/1967  United Kingdom ............ 340/237 S

*Primary Examiner*—Stanley D. Miller, Jr.
*Assistant Examiner*—B. P. Davis
*Attorney, Agent, or Firm*—Harold Christoffersen; Samuel Cohen; Kenneth Watov

[57] ABSTRACT

A high input impedance circuit is employed to sense the condition of a bridge such as a Wheatstone bridge containing ionization chambers for smoke detection. The circuit comprises two CMOS inverters connected to operate as a differential signal detector, one inverter connected at its gate electrodes to one output terminal of the bridge and the other similarly connected to the other output terminal of the bridge. The system includes a simple null and sensitivity adjustment.

9 Claims, 1 Drawing Figure

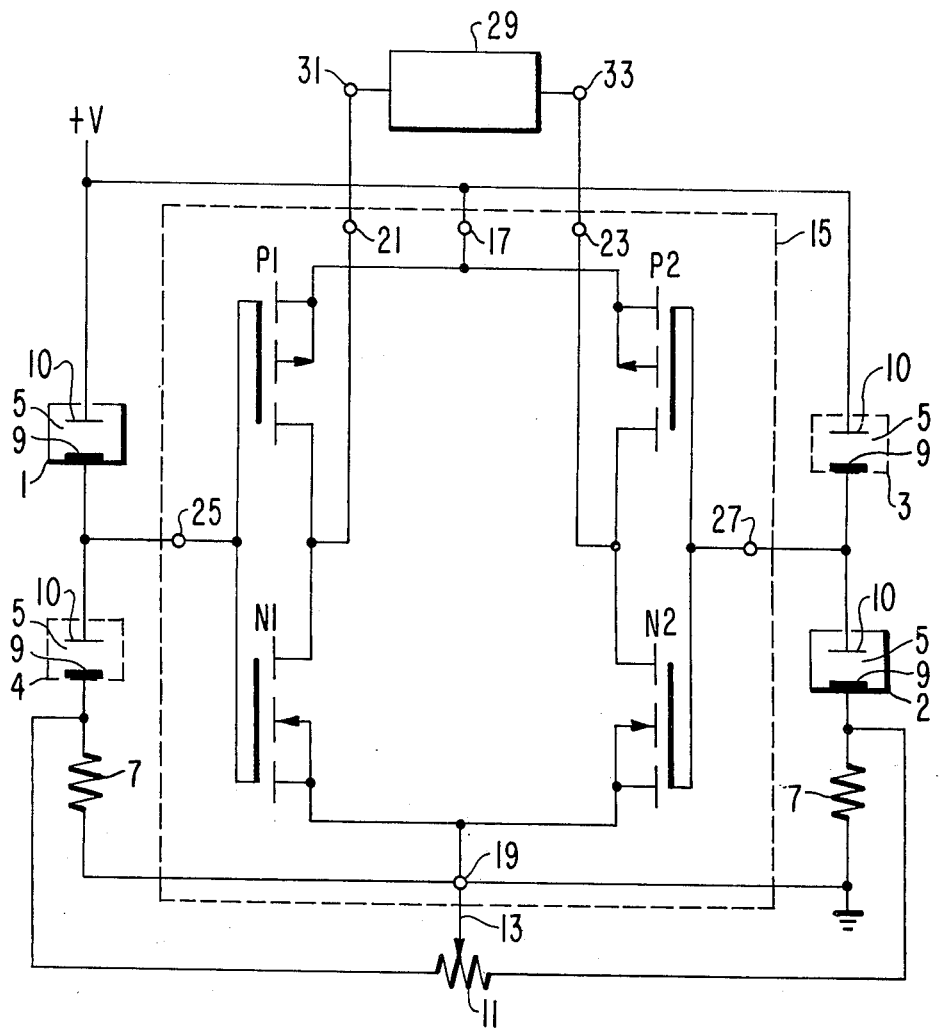

BRIDGE-BALANCE DETECTION CIRCUIT

The invention relates generally to bridge circuits, and more specifically to circuitry for detecting the balance and imbalance of such bridge circuits.

Wheatstone and other bridges often are used in systems for detecting or indicating physical quantities such as temperature, strain, pressure, and the presence of smoke. One or more transducers, each capable of converting the physical variable or quantity being measured to an electrical signal, are connected into one or more arms of the bridge circuit. Such transducers may include thermistors, strain gauges, platinum wire resistance temperature bulbs, photocells, or other sensors.

To obtain optimized operation of the bridge and its detecting circuit, the detecting circuit must not differentially affect the impedance of the bridge arms. Second order effects, which can result from unequal loading, and other causes, adversely affect the sensitivity of the bridge. The transducers discussed above can introduce such second order effects as functions of temperature, atmospheric pressure, humidity, etc., depending upon the type of transducer.

An objective of the present invention is to provide an arrangement in which such second order effects are eliminated or at least greatly reduced. This is accomplished by employing a very high input impedance sensing circuit formed of MOS transistors. In a preferred form of the invention, the circuit includes two CMOS inverters connected at their respective gate electrode connections to the bridge ouput terminals and at their respective drain electrode connections to an indicator circuit such as a voltage comparator.

The invention is illustrated in the drawing the sole FIGURE of which is a schematic diagram of a smoke detector circuit incorporating the present bridge-balance detection circuit. Equivalent components are indicated by like reference numbers.

The smoke detector circuit shown includes four individual transducers or ionization chambers 1,2,3,4 of the radioactive type, interconnected to form a Wheatstone bridge circuit. Two of the ionization chambers 1, 2 connected diagonally opposing to each other, are sealed to prevent smoke from entering their sensitive regions 5. The other two diagonally opposing ionization chambers 3, 4 have open sensitive regions 5 to permit smoke to enter therein. As well understood in the art, each chamber 5 includes means producing ionization such as a source of radioactive material. Except for having sealed and unsealed chambers 5, the smoke transducers 1,2,3,4 are substantially identical in all their other physical and electrical characteristics.

The lower arms of the Wheatstone bridge each further includes a fixed resistor 7 connected between the electrodes 9 of their open chambered and closed chambered transducers 4 and 2 respectively, and ground. A potentiometer 11, having a grounded arm 13, is connected between the electrodes 9 of the transducers 2 and 4.

An integrated circuit 15 is provided as part of the bridge balance detection circuit of the smoke detector. The integrated circuit 15 includes two pairs of complementary-symmetry metal-oxide-semiconductor (MOS) field effect transistors (P1, N1 and P2, N2) on a monolithic silicon substrate. The resistors 7, while shown separately, can be included on the substrate. Each pair of complementary transistors (P1, N1 and P2, N2) is interconnected as a complementary symmetry inverter circuit.

The source electrodes of the p-channel transistors P1, P2, and n-channel transistors N1, N2, are connected to power input terminals 17 and 19, respectively. Inverter P1, N1 is connected at its gate electrodes to input terminal 25 and at its drain electrodes to output terminal 21; inverter P2, N2 is connected at its gate electrodes to input terminal 27 and at its drain electrodes to output terminal 23.

A voltage comparator 29 is connected at its terminals 31, 33 to the ouput terminals 21,23, respectively of the integrated circuit 15. The comparator 29 is included as part of the detection circuit.

The power input terminal 17 of the integrated circuit 15, and the electrodes 10 of the transducers 1 and 3 are connected to a positive voltage source +V. The power input terminal 19 of the integrated circuit is connected to a reference potential, such as ground.

In the discussion of the operation of the bridge-balance detection circuit which follows, it may be assumed that ionization chambers 1 through 4 are substantially identical in their electrical characteristics and that fixed resistors 7 are equal in resistance value. It also may be assumed that the arm of potentiometer 11 is at its midpoint.

Under these conditions, in the absence of smoke, the Wheatstone bridge will be balanced, providing a zero voltage-differential across input terminals 25 and 27 of the integrated circuit 15. Accordingly, there will also be a zero voltage-differential across output terminals 21 and 23 of the integrated circuit 15.

When transducers 3 and 4 are in the presence of smoke, the smoke will enter their sensitive regions 5 and become ionized. The ionized smoke will cause the resistances of transducers 3 and 4 to increase in value, resulting in an increase and decrease in potential at input terminals 25 and 27, respectively, of integrated circuit 15. The two pairs of complementary symmetry MOS field-effect transistors (P1, N1 and P2, N2) operate to sense and invert the voltages appearing at their input terminals 25, 27. Accordingly, output terminals 21 and 23 will decrease and increase in potential respectively. Comparator 29 will sense the voltage differential between output terminals 21 and 23, and toggle to provide output signals indicative of a bridge imbalance condition; which in this illustration also indicates the presence of smoke in the area of the smoke sensor.

The comparator 29 is differentially-toggled to indicate a change in state across the output terminals 21 and 23 of the integrated circuit 15. While in the explanation above it was stated that slider 13 was set at its midpoint, in practice it is preferred initially to unbalance the bridge. The reason is to ensure that comparator 29 is maintained in a quiescent state, for the "no smoke" condition. Accordingly, in a preferred form of the invention, potentiometer 11 initially is adjusted to slightly unbalance the bridge in a sense to cause output terminal 21 to be slightly more positive than output terminal 23.

The degree of bridge imbalance provided by the potentiometer 11 will determine the sensitivity of the smoke sensor to the presence of smoke. In addition, although the transducers 1, 2, 3, 4 are substantially similar to one another, as are the complementary transistors P1, N1, P2, N2, their electrical characteristics cannot be made precisely similar. As a result, second-order inequalities will exist in the form of offset voltages. The offset voltages must be compensated to prevent false or delayed toggling of the comparator 29. Such compensation is automatically provided in adjusting the potentiometer 11 to establish a quiescent or "no smoke" state in the smoke detector. In other words, the potentiometer 11 provides both a sensitivity adjustment, and a means for nulling any asymmetries or offsets due to aging of the components, temperature, humidity, atmospheric pressure, etc., thus preventing spurious or delayed toggling of the comparator 29.

The high input impedance at the input terminals 25, 27 of the integrated circuit 15 (10G Ω), prevents the detecting circuit from loading the Wheatstone bridge. Accordingly, loading errors are substantially eliminated. Second-order inequalities are substantially reduced by placing the complementary transistors P1, N1, P2, N2 upon a single substrate and in close physical proximity to one another so that environmental and other changes will have substantially the same effect upon all of these transistors.

The comparator circuit 29 is only one example of a means for determining the difference of potential between the output terminals 21, 23 of integrated circuit 15. Voltmeters, transistor switches, and differential amplifiers are among the other means that can also be used to sense or determine such potential difference.

The detection circuit is not limited to detecting the balance and imbalance conditions of Wheatstone bridges. Any bridge circuit providing a differential output indicative of the bridge balance or imbalance can incorporate the detection circuit described.

The system described may, for example, be implemented in the following way: Circuit 15 may be an RCA CA3600E COS/MOS transistor array; voltage comparator 29 may be an RCA CA3059 linear integrated circuit zero-voltage switch.

What is claimed is:

1. The combination of:
   a first bridge circuit having two output terminals, each at a different node of the bridge, and
   a second bridge circuit for sensing the condition of the first bridge circuit, said second bridge circuit including four arms and four transistors, each transistor having a conduction path and a control electrode for controlling the conductance of said conduction path, each conduction path forming a different arm of said second bridge circuit, said second bridge circuit having two input terminals at two opposite nodes of the bridge, one such terminal at the control electrodes of two transistors in one pair of adjacent arms of the bridge and the other terminal at the control electrodes of the two transistors in the other pair of adjacent arms of the bridge, one input terminal connected to one output terminal of said first bridge circuit and the other to the other output terminal of said first bridge, said second bridge circuit having also a pair of output terminals, one at the connection of the conduction paths of said one pair of adjacent arms and the other at the connection of the conduction paths of said other pair of adjacent arms.

2. The combination of claim 1, wherein said second bridge circuit comprises:
   two pairs of complementary-symmetry MOS type field-effect transistors interconnected as a pair of complementary-symmetry inverters, each pair of transistors connected gate electrode-to-gate electrode and drain electrode-to-drain electrode, the gate electrodes of one inverter serving as one input terminal and the gate electrodes of the other serving as the other input terminal, each drain electrode-to-drain electrode connection serving as an output terminal, and one transistor of each inverter connected at its source electrode to an operating voltage terminal and the other transistor of each inverter connected at its source electrode to a second operating voltage terminal.

3. The combination of claim 1, wherein said first bridge circuit is a Wheatstone bridge having upper and lower impedance arms, and said detection circuit further includes a potentiometer connected between two of the impedance arms of said Wheatstone bridge, said potentiometer having an arm connected to a reference voltage point for providing offset null and sensitivity adjustment of said first bridge.

4. A smoke detector comprising, in combination:
   four ionization chambers connected in a bridge between two operating voltage terminals, two in one current path between these terminals and the other two in a second current path between these terminals, the first chamber in the first path being closed to prevent the entry of smoke and the second chamber in the first path being open to permit the entry of smoke, the two chambers in the second path also being closed and open, respectively, but located in positions in the second path complementary to those of the chambers in the first path, the connection between the closed and open chamber in each path serving as an output terminal of said bridge;
   a detection circuit comprising two complementary symmetry MOS transistor inverters, each inverter comprising two transistors of complementary conductivity types, connected gate electrode-to-gate electrode and drain electrode-to-drain electrode, each inverter being connected at one source electrode to one of said operating voltage terminals and at its other source electrode to said other operating voltage terminal, one output terminal of said bridge being connected to the gate electrodes of one inverter, the other output terminals of said bridge being connected to the gate electrodes of said other inverter; and
   indicator means connected between the drain electrode connection of one inverter and the drain electrode connection of the other inverter.

5. The smoke detector of claim 4, which further includes:
   means for unbalancing said bridge in the absence of smoke to provide a quiescent condition, and offset null, and a sensitivity control, said bridge being unbalanced in sense opposite to that produced by the presence of smoke.

6. The smoke detector of claim 5, wherein said unbalancing means includes:
   a potentiometer having an arm connected to one of said voltage terminals, and a pair of ends, one connected to an electrode of the open chamber in one path and the other connected to an electrode of the closed chamber in the other path.

7. The smoke detector of claim 4, wherein said first and second inverters are provided in integrated circuit form upon a single substrate.

8. A bridge-balance detection circuit, for detecting the balance and imbalance of a bridge circuit having a differential output signal, indicative of the balance and imbalance conditions of the bridge comprising:

first and second inverters each one of said inverters including serially connected P-channel and N-channel MOSFET transistors having interconnected gate electrodes connected to an individual one of a pair of input terminals, and interconnected drain electrodes connected to an individual one of a pair of output terminals, said P-channel transistors having source electrodes connected to a voltage source, said N-channel transistors having source electrodes connected to a voltage reference, said pair of input terminals being connected to said output signal of said bridge; and means for indicating the balance and imbalance of said bridge circuit, said indicating means having a pair of input terminals connected across said pair of output terminals of said first and second inverters.

9. The bridge-balance detection circuit of claim 8, wherein said bridge circuit is a Wheatstone bridge, having two pairs of upper and lower arms, each of said arms including an impedance means; and said detection circuit further includes a potentiometer connected across the lower impedance arms of said Wheatstone bridge, said potentiometer having an arm connected to a reference voltage for providing an offset null and sensitivity adjustment of said bridge.

* * * * *